(12) United States Patent
Aratani

(10) Patent No.: US 9,958,493 B2
(45) Date of Patent: May 1, 2018

(54) METHOD FOR EVALUATING DEFECT REGION OF SEMICONDUCTOR SUBSTRATE

(71) Applicant: SHIN-ETSU HANDOTAI CO., LTD., Tokyo (JP)

(72) Inventor: Takashi Aratani, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days. days.

(21) Appl. No.: 15/309,584

(22) PCT Filed: Mar. 16, 2015

(86) PCT No.: PCT/JP2015/001431
§ 371 (c)(1),
(2) Date: Nov. 8, 2016

(87) PCT Pub. No.: WO2015/198510
PCT Pub. Date: Dec. 30, 2015

(65) Prior Publication Data
US 2017/0160335 A1  Jun. 8, 2017

(30) Foreign Application Priority Data

Jun. 25, 2014  (JP) ................................ 2014-129850

(51) Int. Cl.
G01R 31/02  (2006.01)
G01R 31/26  (2014.01)
(Continued)

(52) U.S. Cl.
CPC .......... *G01R 31/2639* (2013.01); *C30B 29/06* (2013.01); *C30B 15/20* (2013.01); *C30B 15/30* (2013.01); *C30B 33/00* (2013.01)

(58) Field of Classification Search
CPC .......... G01R 31/31924; G01R 31/3004; G01R 31/2884; G01R 31/3008; G01R 31/2831;
(Continued)

(56) References Cited

U.S. PATENT DOCUMENTS 5,674,756 A * 10/1997 Satoh .................. H01L 21/3225
257/E21.321
5,701,088 A * 12/1997 Fujimaki ............ G01R 31/2831
257/E21.531

(Continued)

FOREIGN PATENT DOCUMENTS

JP    H06-302665 A    10/1994
JP    2001-139396 A    5/2001
(Continued)

OTHER PUBLICATIONS

Jun. 2, 2015 International Search Report issued in International Patent Application No. PCT/JP2015/001431.

*Primary Examiner* — Thang Le
(74) *Attorney, Agent, or Firm* — Oliff PLC

(57) ABSTRACT

A method evaluates a defect region of a semiconductor substrate based on C-V characteristics of a MOS structure formed on the semiconductor substrate, including determining a relationship between defect region and flat band voltage or fixed charge density by using a semiconductor substrate having a known defect region, under a heat treatment condition and a C-V characteristic evaluating condition identical to conditions for evaluating a defect region of a semiconductor substrate to be evaluated, determining a flat band voltage or a fixed charge density of the semiconductor substrate to be evaluated from C-V characteristics of a MOS structure formed on the semiconductor substrate to be evaluated, and identifying the defect region of the semiconductor substrate to be evaluated based on the relationship between defect region and flat band voltage or fixed charge density (Continued)

previously determined, whereby the defect region of the semiconductor substrate is evaluated.

2 Claims, 3 Drawing Sheets

(51) Int. Cl.
*C30B 29/06* (2006.01)
*C30B 33/00* (2006.01)
*C30B 15/20* (2006.01)
*C30B 15/30* (2006.01)

(58) Field of Classification Search
CPC . G01R 31/2648; G01R 31/2639; H01L 22/34; H01L 22/14; C30B 29/06; C30B 15/20; C30B 15/30
USPC .......................... 324/762.01, 762.02, 762.05
See application file for complete search history.

(56) References Cited

U.S. PATENT DOCUMENTS

| | | | |
|---|---|---|---|
| 5,714,679 A * | 2/1998 | Nichols | F02P 17/12 324/399 |
| 6,544,490 B1 | 4/2003 | Takeno et al. | |
| 7,846,822 B2 * | 12/2010 | Seebauer | H01L 21/306 257/E21.135 |
| 8,529,695 B2 * | 9/2013 | Harada | C30B 15/203 117/13 |
| 2003/0116082 A1 | 6/2003 | Sakurada et al. | |
| 2004/0251923 A1 | 12/2004 | Mazur | |
| 2005/0282366 A1 * | 12/2005 | Wee | G01R 31/311 438/514 |
| 2014/0132286 A1 * | 5/2014 | Oborina | G01R 31/311 324/658 |

FOREIGN PATENT DOCUMENTS

| | | |
|---|---|---|
| JP | 2002-201093 A | 7/2002 |
| JP | 2005-045216 A | 2/2005 |
| JP | 2006-278892 A | 10/2006 |

* cited by examiner

METHOD FOR EVALUATING DEFECT REGION OF SEMICONDUCTOR SUBSTRATE

TECHNICAL FIELD

The present invention relates to a method for evaluating a defect region of a semiconductor substrate.

BACKGROUND ART

Semiconductor silicon wafers (hereinafter, referred to as wafers) have typically been used as a substrate with an integrated circuit. In particular, it is desirable for a region where the integrated circuit is formed to have no defects.

Examples of defects contained in the wafers include grown-in defects, which are incorporated during production of a semiconductor single crystal by the CZ method or the like. The defects include a vacancy, in which an atom is missing from a regular crystal lattice site, and interstitial silicon, in which an atom is located between lattice sites.

A region containing many vacancies is called V-region; a region containing many interstitial silicons is called I-region. Between the V-region and the I-region is present N-region, which contains no (or few) vacancies and interstitial silicons. It is assumed that the concentrations of vacancies and interstitial silicons are determined by a relationship between a crystal pulling rate (a growth rate) in the CZ method and a temperature gradient near a solid-liquid interface of a crystal. The N-region can include an area where defects called oxidation induced stacking faults (OSFs) are generated. N-region free from the OSFs is desirably used for producing the integrated circuit devices.

It is important for production of semiconductor single crystals to control the crystal defect regions. Thus, a technique for detecting and evaluating grown-in defects is required.

Many studies have been reported on the technique for detecting and evaluating grown-in defects.

For example, Patent Literatures 1 and 2 disclose methods that include subjecting a wafer segment to heat treatment, measuring an oxide precipitate density in the wafer, and determining a crystal defect region based on the measured value.

Moreover, Patent Literature 3 discloses a method that includes contaminating the surface of a wafer with Fe to visually identify a crystal defect-free region in a silicon single crystal.

CITATION LIST

Patent Literature

Patent Literature 1: Japanese Unexamined Patent publication (Kokai) No. 2001-139396
Patent Literature 2: Japanese Unexamined Patent publication (Kokai) No. 2002-201093
Patent Literature 3: Japanese Unexamined Patent publication (Kokai) No. 2006-278892

SUMMARY OF INVENTION

Technical Problem

Unfortunately, the methods of Patent Literatures 1 to 3 require complicated processes such as multiple heat treatments and surface contamination.

Moreover, the conventional evaluation methods, which identify Ni-region (N-region where interstitial silicons are dominant) and Nv-region (N-region where vacancies are dominant) by evaluating the presence of oxide precipitates or gettering capability after contamination, are difficult to identify the defect regions when the wafer has so low oxygen concentration that oxygen is not easily precipitated.

The present invention was accomplished in view of the above-described problems. It is an object of the present invention to provide a method for evaluating a defect region of a semiconductor substrate that can simply and easily identify the defect region of the semiconductor substrate even when the oxygen concentration is low.

Solution to Problem

To achieve this object, the present invention provides a method for evaluating a defect region of a semiconductor substrate based on C-V characteristics of a MOS structure formed on the semiconductor substrate, the method comprising: determining a relationship between defect region and flat band voltage or fixed charge density by using a semiconductor substrate having a known defect region, under a heat treatment condition and a C-V characteristic evaluating condition identical to conditions for evaluating a defect region of a semiconductor substrate to be evaluated; and determining a flat band voltage or a fixed charge density of the semiconductor substrate to be evaluated from C-V characteristics of a MOS structure formed on the semiconductor substrate to be evaluated, and identifying the defect region of the semiconductor substrate to be evaluated based on the relationship between defect region and flat band voltage or fixed charge density previously determined, whereby the defect region of the semiconductor substrate is evaluated.

When a defect region of a semiconductor substrate is identified based on a flat band voltage or a fixed charge density determined from C-V characteristics of a MOS structure formed on the semiconductor substrate, the defect region of the semiconductor substrate can be simply and easily identified with high precision even if the semiconductor substrate has a low oxygen concentration.

The identifying the defect region of the semiconductor substrate to be evaluated may include identifying the defect region as V-region, where vacancies are dominant, Nv-region, which is N-region where vacancies are dominant, Ni-region, which is N-region where interstitial silicons are dominant, or I-region, where interstitial silicons are dominant.

Such identification can be suitably performed to identify the defect region of the semiconductor substrate to be evaluated.

Advantageous Effects of Invention

As described previously, the present invention can simply and easily identify a defect region of a semiconductor substrate even if the semiconductor substrate has a low oxygen concentration.

DESCRIPTION OF EMBODIMENTS

Figure 1:
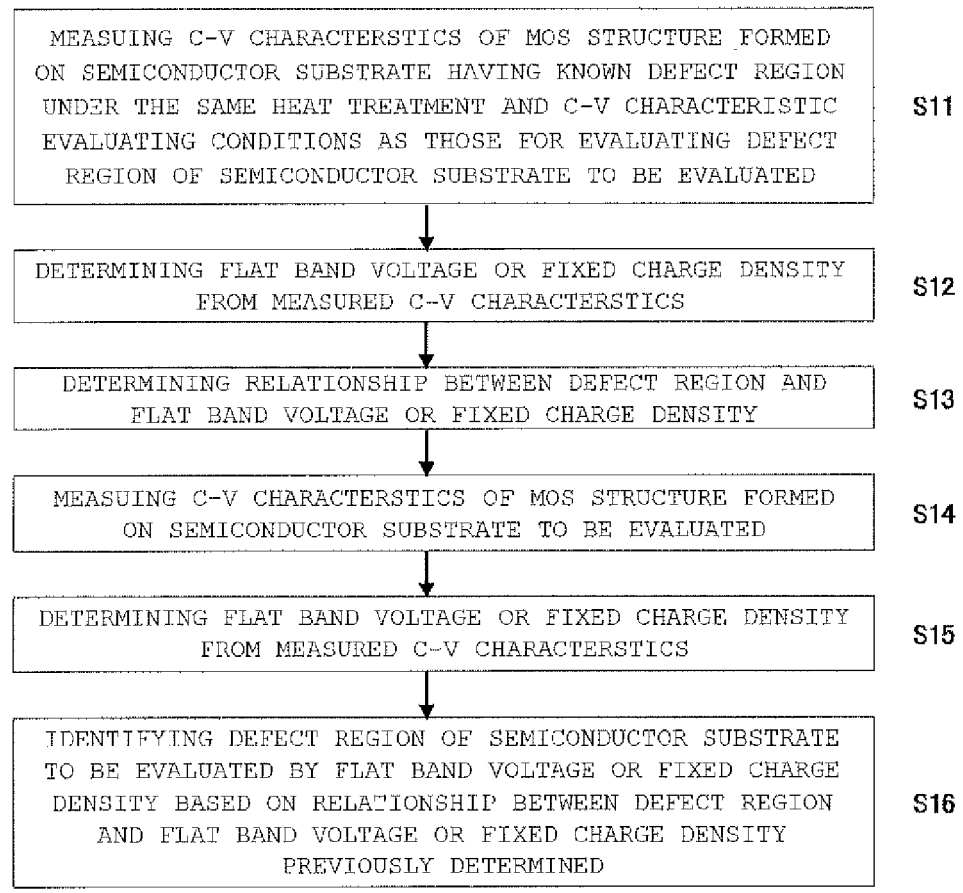
FIG. 1 is a flow chart showing a method for evaluating a defect region of a semiconductor substrate of the present invention.

Hereinafter, embodiments of the present invention will be described in detail with reference to the drawings, but the present invention is not restricted thereto.

As described previously, it is important for production of semiconductor single crystals to control the crystal defect regions. Thus, a technique for detecting and evaluating grown-in defects is required. Many studies have been reported on the technique for detecting and evaluating grown-in defects, like the methods disclosed in Patent Literatures 1 to 3. However, these methods require complicated processes such as multiple heat treatments and surface contamination.

Moreover, the conventional evaluation methods, which identify Ni-region and Nv-region by evaluating the presence of oxide precipitates or gettering capability after contamination, are difficult to identify the defect regions when the wafer has so low oxygen concentration that oxygen is not easily precipitated.

In view of this, the present inventor repeatedly and keenly conducted studies on a method for evaluating a defect region of a semiconductor substrate that can simply and easily identify a defect region of a semiconductor substrate even if the semiconductor substrate has a low oxygen concentration.

The present inventor, first, has focused attention on points that the change amount of a flat band voltage ($V_{fb}$) in C-V characteristics of a MOS (Metal-Oxide-Silicon) capacitor is determined by a fixed charge density in its oxide film if the semiconductor substrates have the same impurity concentration, and fixed charges in the oxide film are attributable to interstitial silicon in the oxide film.

The flat band voltage ($V_{fb}$) will now be described.

Energy band diagram of an ideal MOS structure has a flat band without bending unless voltage is applied from outside. The band is bent by voltage applied from outside.

The ideal state means that there is no difference between work function of electrodes and Fermi level of the semiconductor substrate, and the oxide film does not contain fixed charges.

However, a usual MOS capacitor has a difference between work function of electrodes and Fermi level of the semiconductor substrate, and the oxide film contains fixed charges, unlike in the ideal state. Thus, the energy band is bent even when voltage is not applied from outside.

The flat band voltage ($V_{fb}$) is voltage applied from outside for flattening the energy band without bending.

The flat band voltage ($V_{fb}$) is given by formula (1), where $W_m$ represents work function of the metal electrodes, $E_f$ represents Fermi level of the semiconductor substrate, dox represents the thickness of the oxide film, and $Q_s$ represents the amount of fixed charges in the oxide film.

$$V_{fb}=(W_m-E_f)+(Q_s/dox) \tag{1}$$

The metal electrode work function $W_m$ depends on a material of the metal electrodes. The semiconductor substrate Fermi level $E_f$ is given by formula (2).

$$E_i-E_f=(kT/q)\cdot\log(N_{sub}/n_i) \tag{2}$$

In the above formula, $E_f$ represents Fermi level, $E_i$ represents intrinsic Fermi level, k represents Boltzmann constant, T represents temperature, q represents elementary charge, $N_{sub}$ represents impurity concentration of the semiconductor substrate, and $n_i$ represents intrinsic carrier concentration.

Formula (2) indicates that the Fermi level $E_f$ is determined by the semiconductor substrate impurity concentration $N_{sub}$ under a constant temperature condition.

The MOS capacitor capacity C with a flat band is a series connection of oxide film capacity $C_{ox}$ and depletion layer capacity $C_d$, as shown by formula (3).

$$C=C_{ox}\cdot C_d/(C_{ox}+C_d) \tag{3}$$

The oxide film capacity $C_{ox}$, the depletion layer capacity $C_d$, and the depletion layer width $L_d$ with a flat band are shown by formulae (4), (5), and (6), respectively.

$$C_{ox}=\epsilon_o\cdot S/dox \tag{4}$$

$$C_d=\epsilon\cdot S/L_d \tag{5}$$

$$L_d=(kT\cdot\epsilon/N_{sub}\cdot q^2)^{1/2} \tag{6}$$

In the above formulae, S represents the area of the capacitor, $\epsilon_o$ represents the permittivity of the oxide film, and $\epsilon$ represents the permittivity of the semiconductor substrate.

The flat band voltage $V_{fb}$ and the semiconductor substrate impurity concentration $N_{sub}$ can be calculated from a result of the C-V characteristics. Thus, when the C-V characteristics can be measured, the amount of fixed charges $Q_s$ can be calculated by formulae (1) and (2), and the fixed charge density $Q_d$ shown by formula (7) can thus be calculated.

$$Q_d=Q_s/(S\cdot q) \tag{7}$$

Next, the relationship between fixed charges and crystal defects in a substrate will be described.

The fixed charges in the oxide film are generally positive charges. The positive charges are considered interstitial silicons that are caused when the oxide film is formed by thermally oxidizing a silicon single crystal and then partially remain in the oxide film, as shown by the following chemical formula (8).

$$Si+O_2 \rightarrow SiO_2+(Si^+) \tag{8}$$

The most popular method for forming the oxide film is a heat treatment at high temperature under an oxygen atmosphere or water vapor atmosphere. In this method, the oxide film is formed by consuming silicon in the substrate.

In this context, the present inventor has considered that the fixed charges in the oxide film are attributable to interstitial silicon, and in the case that the oxide film is formed by consuming silicon in the substrate, for example, through the thermal oxidation, the fixed charges in the oxide film are correlative with the amount of interstitial silicons and vacancies contained in the substrate.

Furthermore, the present inventor has considered that since the fixed charge density can be calculated with the flat band voltage in the C-V characteristics as described above, the amount of interstitial silicons and vacancies in a silicon single crystal can be estimated from the flat band voltage or the fixed charge density in the C-V characteristics. Then, the present inventor found that when a defect region of a semiconductor substrate is identified based on a flat band voltage or a fixed charge density determined from C-V characteristics of a MOS structure formed on the semiconductor substrate, the defect region of the semiconductor substrate can be simply and easily identified with high precision even if the semiconductor substrate has a low oxygen concentration, thereby bringing the present invention to completion.

Hereinafter, an embodiment of the method for evaluating a defect region of a semiconductor substrate of the present invention will be described with reference to FIG. 1.

First, C-V characteristics of a MOS structure formed on a semiconductor substrate whose defect region type is known are measured under the same heat treatment and C-V characteristic evaluating conditions as those for evaluating a defect region of a semiconductor substrate to be evaluated (see Step S11 in FIG. 1).

The type of the defect region of the semiconductor substrate whose C-V characteristics are measured in Step S11 may be previously identified, for example, in the following manner: a single crystal silicon ingot from which the semiconductor substrate is sliced out is subjected to the evaluation method shown in Patent Literature 1 to calculate the density of oxide precipitates and identify the type of the defect region based on the density of oxide precipitates.

The MOS structure can be produced by, for example, forming a thermal oxide film on the semiconductor substrate and then forming metal electrodes having a prescribed area on the thermal oxide film. When a mercury probe is used for measuring the C-V characteristics, the formation of the metal electrodes may be omitted.

Then, a flat band voltage or a fixed charge density is determined from the C-V characteristics measured in step S11 (see Step S12 in FIG. 1).

More specifically, the flat band voltage $V_{fb}$ and the semiconductor substrate impurity concentration $N_{sub}$ can be calculated from a result of the C-V characteristics. When the C-V characteristics are determined, the flat band voltage $V_{fb}$ can be calculated. When the flat band voltage $V_{fb}$ is determined, the amount of fixed charges $Q_s$ can be calculated by the formulae (1) and (2), and the fixed charge density $Q_d$ expressed by the formula (7) can thus be calculated.

Then, a relationship between defect region and flat band voltage or fixed charge density is determined (see Step S13 in FIG. 1).

More specifically, the type of the defect region is associated with ranges of the flat band voltage $V_{fb}$ or the fixed charge density $Q_d$, based on the flat band voltage $V_{fb}$ or the fixed charge density $Q_d$ determined in step S12.

Examples of the type of the defect region include V-region, where vacancies are dominant, Nv-region, which is N-region where vacancies are dominant, Ni-region, which is N-region where interstitial silicons are dominant, and I-region, where interstitial silicons are dominant.

Then, C-V characteristics of a MOS structure formed on a semiconductor substrate to be evaluated are measured (see Step S14 in FIG. 1).

The MOS structure of the substrate to be evaluated can also be produced by, for example, forming a thermal oxide film on the semiconductor substrate and then forming metal electrodes having a prescribed area on the thermal oxide film. When a mercury probe is used for measuring the C-V characteristics, the formation of the metal electrodes may be omitted.

Then, a flat band voltage or a fixed charge density is determined from the C-V characteristics measured in step S14 (see Step S15 in FIG. 1).

More specifically, the flat band voltage $V_{fb}$ or the fixed charge density $Q_d$ is calculated from the C-V characteristics as in step S12.

Then, the defect region of the semiconductor substrate to be evaluated is identified by the flat band voltage or the fixed charge density determined in Step S15, based on the relationship between defect region and flat band voltage or fixed charge density previously determined in step S13 (see Step S16 in FIG. 1).

The identification of the defect region of the semiconductor substrate to be evaluated may include identifying the defect region as V-region, where vacancies are dominant, Nv-region, which is N-region where vacancies are dominant, Ni-region, which is N-region where interstitial silicons are dominant, or I-region, where interstitial silicons are dominant.

Such identification can be suitably performed to identify the defect region of the semiconductor substrate to be evaluated.

According to the method for evaluating a defect region of a semiconductor substrate of the present invention as described above with reference to FIG. 1, the defect region of the semiconductor substrate can be simply and easily identified even if the semiconductor substrate has a low oxygen concentration.

EXAMPLES

The present invention will be more specifically described below with reference to examples, but the present invention is not restricted thereto.

(Examples)

First, p-type silicon single crystal ingots having a diameter of 300 mm, an axis orientation <100>, a resistivity of 10 to 30 Ω·cm, and an oxygen concentration of 15 ppma (JEIDA) were produced by the CZ method.

In the production by the CZ method, a pulling rate was changed to adjust the concentration of defects in the crystals so that each crystal had V-region, where vacancies are dominant, Nv-region, which is N-region where vacancies are dominant, Ni-region, which is N-region where interstitial silicons are dominant, or I-region, where interstitial silicons are dominant. These single crystal ingots were then sliced and polished to produce polished wafers (semiconductor substrates).

The defect region of each wafer was identified based on the density of oxygen precipitates calculated according to the evaluation method shown in Patent Literature 1.

These wafers were then cleaned by RCA cleaning and subjected to heat treatment in a vertical heat treatment furnace at 900° C. under an oxygen atmosphere to form a thermal oxide film with a thickness of 25 nm on the front and back surfaces of each wafer. Thereafter, the oxide film on the back surface of the wafer was removed with HF steam.

Then, high-frequency C-V characteristics of the wafers were measured with a mercury probe CVmap 92, made by Four Dimensions Inc. The measurement was performed at the center of each wafer. The measurement conditions were varied by changing the voltage from 4V to −4V at a measurement frequency of 1 MHz.

Figure 2:
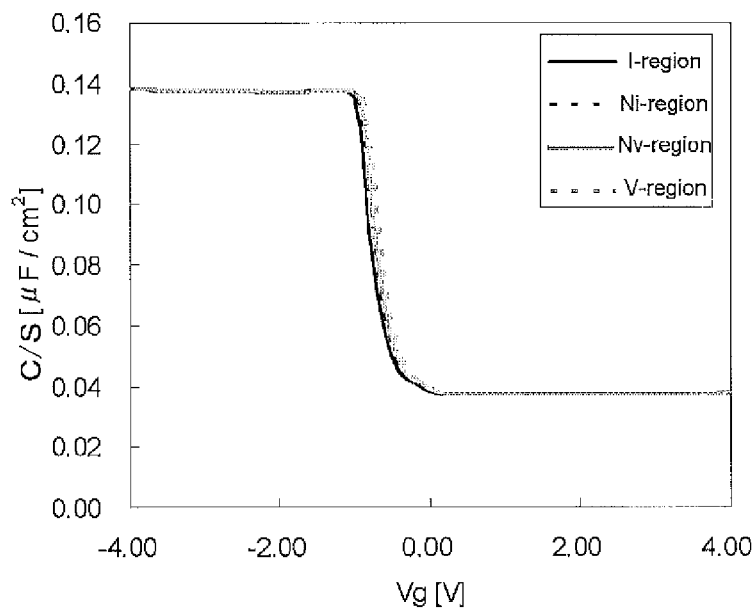
FIG. 2 is a diagram showing C-V characteristics of MOS capacitors formed on semiconductor substrates having various types of defect regions.

FIG. 2 shows C-V characteristic curves of the respective wafers having a defect region of V-region, Nv-region, Ni-region, or I-region. The horizontal axis represents bias voltage Vg; the vertical axis represents C/S, i.e., the capacity normalized with the capacity area. Although all defect regions had the almost same shape of the C-V characteristic curve, their rising portions varied from each other.

Figure 3:
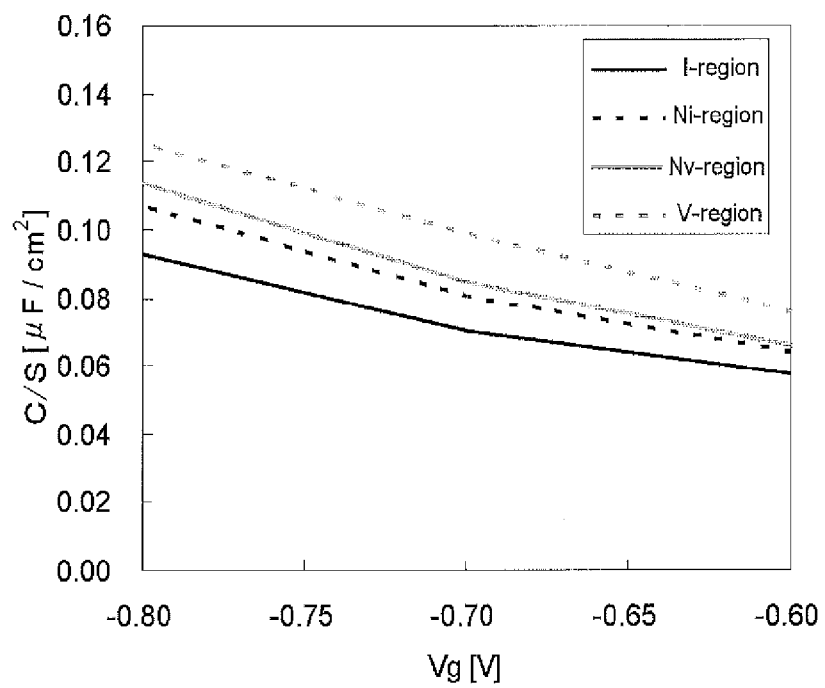
FIG. 3 is an enlarged view of a rising portion of the C-V characteristics in FIG. 2.

FIG. 3 is an enlarged view of the rising portions of the C-V characteristic curves shown in FIG. 2. FIG. 3 indicates that the rising portions clearly varied according to the type of the defect region, and the defect region containing more interstitial silicon and less vacancies had the C-V characteristic curve more negatively shifted.

Figure 4:
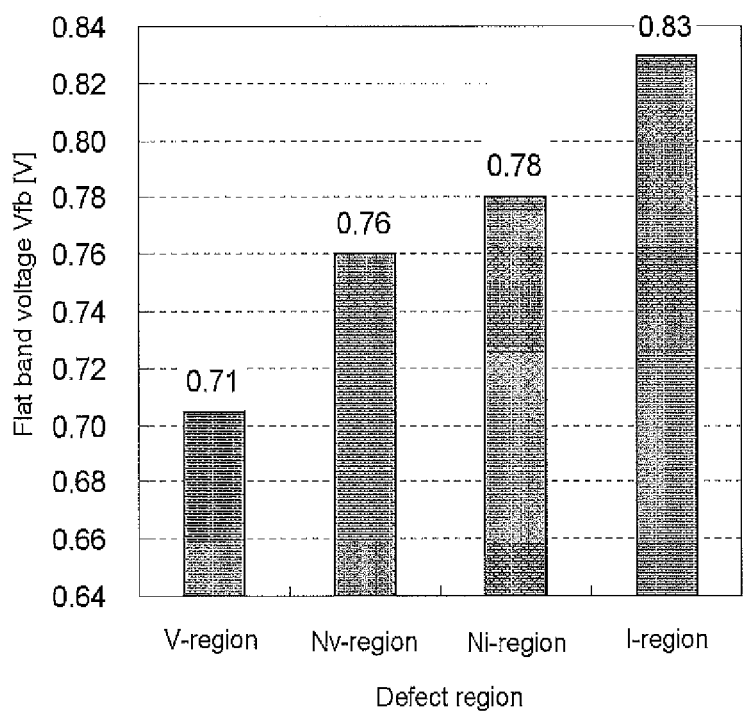
FIG. 4 is a diagram showing a flat band voltage ($V_{fb}$) of the semiconductor substrates having various types of defect regions.
Figure 5:
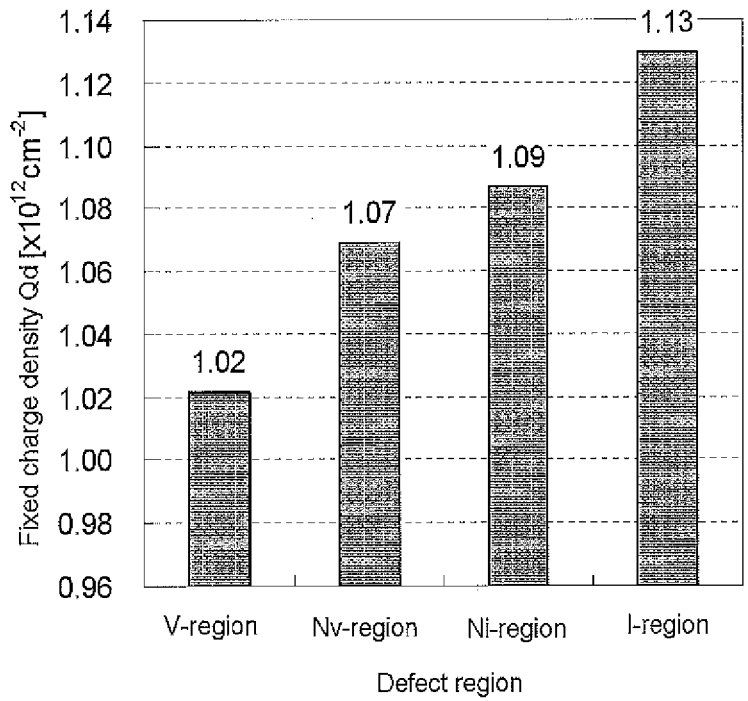
FIG. 5 is a diagram showing fixed charge density ($Q_d$) of the semiconductor substrates having various types of defect regions.

Furthermore, the flat band voltage $V_{fb}$ or the fixed charge density $Q_d$ of each crystal was calculated based on the C-V characteristic curve shown in FIGS. 2 and 3 by the method described above. The result is given in FIGS. 4 and 5.

Figure 6:
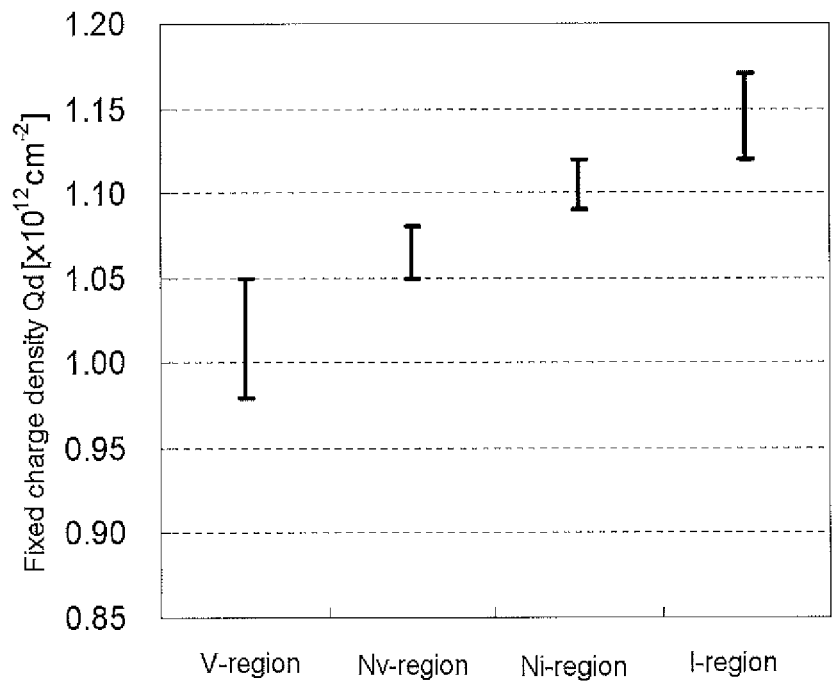
FIG. 6 is a diagram showing a relationship between fixed charge density and defect region.

Furthermore, the number of samples was increased, and a relationship between the fixed charge density $Q_d$ and the type of the defect region was defined as shown in FIG. 6, based on the obtained results.

A relationship between the flat band voltage $V_{fb}$ and the type of the defect region can also be defined as in FIG. 6.

Subsequently, a MOS structure was formed on wafers 1 to 5 to be evaluated (semiconductor substrates to be evaluated) by the method described above, and their C-V characteristic curves were obtained by the method described above. The fixed charge density $Q_d$ was then calculated from the flat band voltage $V_{fb}$, and the type of the defect region was determined based on the relationship between fixed charge density $Q_d$ and defect region type, shown in FIG. 6. The result is given in Table 1.

If the relationship between flat band voltage $V_{fb}$ and defect region type is defined, the type of the defect region can be likewise determined from the flat band voltage $V_{fb}$.

In addition, the density of oxide precipitates was calculated on wafers obtained from the same crystals as the wafers 1 to 5 to be evaluated, according to the evaluation method shown in Patent Literature 1. The type of the defect region was determined based on the calculated density of oxide precipitates. The result is given in Table 1.

TABLE 1

|  | Identification by the present invention | Identification by oxide precipitates |
|---|---|---|
| Wafer 1 | I-region | I-region |
| Wafer 2 | Ni-region | Ni-region |
| Wafer 3 | I-region | I-region |
| Wafer 4 | Nv-region | Nv-region |
| Wafer 5 | V-region | V-region |

As shown in Table 1, the identification result by the present invention was consistent with the result identified by the density of oxide precipitates according to the evaluation method shown in Patent Literature 1.

This indicates that the evaluation method using the fixed charge density of the present invention can identify a defect region with high precision.

In this method, a fixed charge density in an oxide film is calculated, and the identification is performed based on the calculated fixed charge density. Thus, the method can identify a defect region regardless of the oxygen concentration of a semiconductor substrate to be evaluated.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for evaluating a defect region of a semiconductor substrate based on capacity-voltage (C-V) characteristics of a metal-oxide-semiconductor (MOS) structure formed on the semiconductor substrate, the method comprising:
    determining a relationship between the defect region and a flat band voltage or a fixed charge density by using a semiconductor substrate having a known defect region, under a heat treatment condition and a C-V characteristic evaluating condition identical to conditions for evaluating the defect region of the semiconductor substrate to be evaluated; and
    determining the flat band voltage or the fixed charge density of the semiconductor substrate to be evaluated from C-V characteristics of the MOS structure formed on the semiconductor substrate to be evaluated, and identifying the defect region of the semiconductor substrate to be evaluated based on the relationship between the defect region and the flat band voltage or the fixed charge density previously determined, whereby the defect region of the semiconductor substrate is evaluated.

2. The method for evaluating the defect region of the semiconductor substrate according to claim 1, wherein the identifying the defect region of the semiconductor substrate to be evaluated includes identifying the defect region as V-region, where vacancies are dominant, Nv-region, which is N-region where vacancies are dominant, Ni-region, which is N-region where interstitial silicons are dominant, or I-region, where interstitial silicons are dominant.

* * * * *